(12) United States Patent
Shih et al.

(10) Patent No.: US 9,881,917 B2
(45) Date of Patent: Jan. 30, 2018

(54) SEMICONDUCTOR DEVICE AND METHOD OF MANUFACTURING THE SAME

(71) Applicant: ADVANCED SEMICONDUCTOR ENGINEERING, INC., Kaohsiung (TW)

(72) Inventors: Hsu-Chiang Shih, Kaohsiung (TW); Sheng-Chi Hsieh, Kaohsiung (TW); Chien-Hua Chen, Kaohsiung (TW); Teck-Chong Lee, Kaohsiung (TW)

(73) Assignee: ADVANCED SEMICONDUCTOR ENGINEERING, INC., Kaosiung (TW)

(*) Notice: Subject to any disclaimer, the term of this patent is extended or adjusted under 35 U.S.C. 154(b) by 0 days.

(21) Appl. No.: 14/801,730

(22) Filed: Jul. 16, 2015

(65) Prior Publication Data

US 2017/0018550 A1    Jan. 19, 2017

(51) Int. Cl.
| | |
|---|---|
| H01L 27/10 | (2006.01) |
| H01L 23/48 | (2006.01) |
| H01G 4/30 | (2006.01) |
| H01L 27/08 | (2006.01) |
| H01L 49/02 | (2006.01) |

(52) U.S. Cl.
CPC ........... *H01L 27/0805* (2013.01); *H01G 4/30* (2013.01); *H01L 23/481* (2013.01); *H01L 27/101* (2013.01); *H01L 28/60* (2013.01); *H01L 2224/18* (2013.01)

(58) Field of Classification Search
CPC . H01L 27/08; H01L 27/0676; H01L 27/0788; H01L 27/0288; H01L 27/101; H01L 27/0805; H01L 23/481; H01L 23/5223; H01L 23/5222; H01L 2027/11842; H01L 2924/1205; H01L 2924/19041; H01L 28/60; H01L 28/40; H01L 28/55; H01L 28/56; H01L 28/57; H01G 4/30; H01G 4/38; H01G 5/38; H01G 7/00
See application file for complete search history.

(56) References Cited

U.S. PATENT DOCUMENTS 8,188,786 B2 * 5/2012 Hsu .................. H01L 22/22
   327/427
8,883,606 B2 11/2014 Koutsaroff et al.
(Continued)

*Primary Examiner* — Galina Yushina
(74) *Attorney, Agent, or Firm* — Foley & Lardner LLP; Cliff Z. Liu

(57) ABSTRACT

A semiconductor device and a method for manufacturing the same is described. The semiconductor device includes a substrate, a first capacitor and a second capacitor. The first capacitor includes a first conductive layer, a first insulating layer and a second conductive layer. The first conductive layer is disposed on the substrate. The first insulating layer is disposed on the first conductive layer and has a first peripheral edge. The second conductive layer is disposed on the first insulating layer and has a second peripheral edge. The second capacitor includes a third conductive layer, a second insulating layer and the second conductive layer. The second insulating layer is disposed on the second conductive layer and has a third peripheral edge. The third conductive layer is disposed on the second insulating layer and has a fourth peripheral edge. The first, second, third and fourth peripheral edges are aligned with one another.

16 Claims, 13 Drawing Sheets

(56) References Cited

U.S. PATENT DOCUMENTS

| | | | |
|---|---|---|---|
| 2002/0063271 A1* | 5/2002 | Kim | H01L 27/11502 257/295 |
| 2007/0209201 A1* | 9/2007 | Koutsaroff | H01G 4/33 29/846 |
| 2009/0141426 A1* | 6/2009 | Hwang | H01G 4/012 361/321.2 |
| 2014/0240939 A1* | 8/2014 | Sibuet | H05K 13/046 361/767 |

* cited by examiner

SEMICONDUCTOR DEVICE AND METHOD OF MANUFACTURING THE SAME

BACKGROUND

1. Technical Field

The present disclosure relates to a semiconductor device and a method of manufacturing the same. In particular, the present disclosure relates to a semiconductor device having integrated passive components and a method of manufacturing the same.

2. Description of the Related Art

As semiconductor technology evolves, there is a desire to integrate different circuit components into a single chip or integrated circuit (IC) package. There is also a desire to integrate different chips both vertically and horizontally in a single package. However, it can be difficult to integrate different types of components in a single package. Thus, an improved technique for integrating components in a semiconductor package would be beneficial.

SUMMARY

In accordance with an embodiment of the present disclosure, a semiconductor device includes a substrate, a first capacitor and a second capacitor. The first capacitor includes a first conductive layer, a first insulating layer and a second conductive layer. The first conductive layer is disposed on the substrate. The first insulating layer is disposed on the first conductive layer and has a first peripheral edge. The second conductive layer is disposed on the first insulating layer and has a second peripheral edge. The second capacitor includes a third conductive layer, a second insulating layer and the second conductive layer. The second insulating layer is disposed on the second conductive layer and has a third peripheral edge. The third conductive layer is disposed on the second insulating layer and has a fourth peripheral edge. The first, second, third and fourth peripheral edges are aligned with one another.

In accordance with an embodiment of the present disclosure, a method of manufacturing a semiconductor device includes providing a substrate, forming a first conductive layer on the substrate, forming a first insulating layer on the first conductive layer, forming a second conductive layer on the first insulating layer, forming a second insulating layer on the second conductive layer, and forming a third conductive layer on the second insulating layer. The method further includes removing a portion of each of the first insulating layer, the second conductive layer, the second insulating layer and the third conductive layer such that at least a peripheral edge of each of the first insulating layer, the second conductive layer, the second insulating layer and the third conductive layer are aligned with one another along at least one side.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing devices with reduced package sizes. The techniques are cost effective and compatible with forming 2.5D and 3D IC packages.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
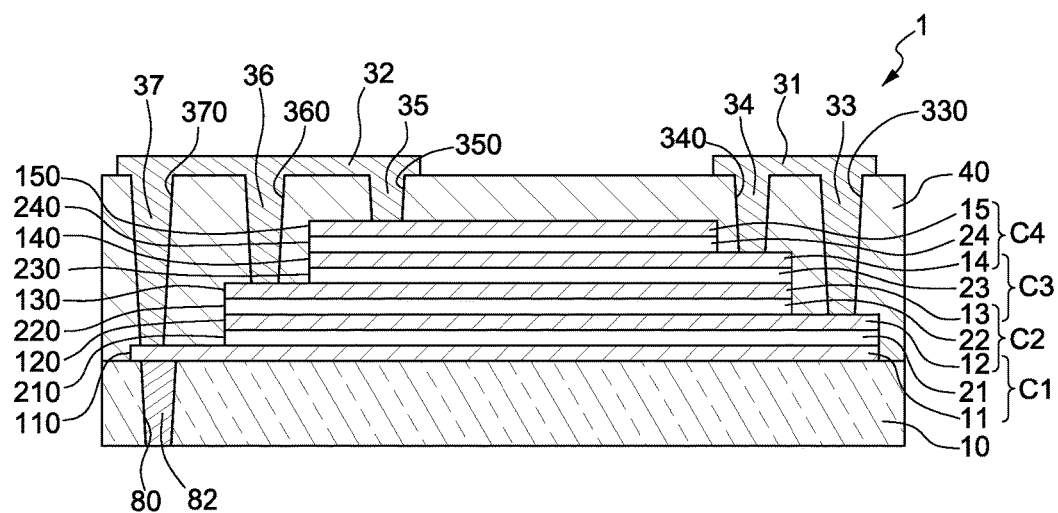
FIG. 1 is a cross-sectional view of a semiconductor device in accordance with an embodiment of the present disclosure.

FIG. 1 is a cross-sectional view of a semiconductor device 1 in accordance with an embodiment of the present disclosure. The semiconductor device 1 includes a substrate 10, conductive layers 11, 12, 13, 14 and 15, insulating layers 21, 22, 23, and 24, a passivation layer 40, a conductive post 82, conductive pads 31 and 32, and a plurality of interconnection structures 33, 34, 35, 36 and 37.

In one or more embodiments, the substrate 10 includes one or more of glass, silicon and silicon dioxide ($SiO_2$). The conductive post 82 extends from a top surface of the substrate 10 to a bottom surface of the substrate 10. The conductive post 82 is formed in a through hole 80 of the substrate 10. In one or more embodiments, the conductive post 82 includes copper (Cu). In other embodiments, the conductive post 82 includes another suitable metal or alloy. In one or more embodiments, the substrate 10 may include one or more embedded active components (e.g., ICs), one or more active components disposed on the substrate 10, or more.

The conductive layer 11 is disposed on the top surface of the substrate 10 and is electrically connected to the conductive post 82. In one or more embodiments, the conductive layer 11 is directly physically connected to the conductive post 82. The insulating layer 21 is disposed on the conductive layer 11. The conductive layer 12 is disposed on the insulating layer 21. The insulating layer 22 is disposed on the conductive layer 12. The conductive layer 13 is disposed on the insulating layer 22. The insulating layer 23 is disposed on the conductive layer 13. The conductive layer 14 is disposed on the insulating layer 23. The insulating layer 24 is disposed on the conductive layer 14. The conductive layer 15 is disposed on the insulating layer 24.

The conductive layers 11 and 12, together with the insulating layer 21, form a capacitor C1. The conductive layers 12 and 13, together with the insulating layer 22, form a capacitor C2. The conductive layers 13 and 14, together with the insulating layer 23, form a capacitor C3. The conductive layers 14 and 15, together with the insulating layer 24, form a capacitor C4.

In one or more embodiments, the conductive layer 11 includes one or more of aluminum (Al) or Cu, or an alloy thereof (such as AlCu). In other embodiments, the conductive layer 11 includes another suitable conductive material, metal or alloy. In one or more embodiments, the conductive layer 15 includes the same or a similar material to the material used for conductive layer 11. In one or more embodiments, conductive layer 12 includes one or more of tantalum (Ta), Cu, or Al, or an alloy thereof (such as AlCu). In other embodiments, conductive layer 12 includes another suitable conductive material, metal or alloy. In one or more embodiments, the conductive layer 13 includes the same or a similar material to the material used for conductive layer 12. In one or more embodiments, the conductive layer 14 includes the same or a similar material to the material used for conductive layer 12. Further, some of, or all of, the conductive layers 11, 12, 13 and 14 may each include different materials.

In one or more embodiments, the top conductive layer of the semiconductor device 1, which is the conductive layer 15 in the embodiment illustrated in FIG. 1, includes one or more of Al or Cu, or an alloy thereof (such as AlCu). In other embodiments, the top conductive layer includes another suitable conductive material, metal or alloy. In one or more embodiments, the top conductive layer includes a same material as one or more of the conductive layers 11, 12, 13 and 14.

In one or more embodiments, the conductive layers 13, 14 and 15 and the insulating layers 22, 23 and 24 are eliminated, such that the top conductive layer of the semiconductor device 1 is the conductive layer 12.

In one or more embodiments, each of the insulating layers 21, 22, 23 and 24 includes a metal oxide, such as an oxide of Ta (e.g., $Ta_2O_5$). In one or more embodiments, one or more of the insulating layers 21, 22, 23 and 24 include another suitable insulating material. Further, some of, or all of, the insulating layers 21, 22, 23 and 24 may each include different materials.

The conductive layer 11 has a peripheral edge 110. The insulating layer 21 has a peripheral edge 210. The conductive layer 12 has a peripheral edge 120. The insulating layer 22 has a peripheral edge 220. The conductive layer 13 has a peripheral edge 130. The insulating layer 23 has a peripheral edge 230. The conductive layer 14 has a peripheral edge 140. The insulating layer 24 has a peripheral edge 240. The conductive layer 15 has a peripheral edge 150.

A side (e.g., shown at the left in FIG. 1) of each of the peripheral edges 210, 120, 220 and 130 are aligned with one another. A side (e.g., shown at the left in FIG. 1) of each of the peripheral edges 230, 140, 240 and 150 are aligned with one another. Another side (e.g., shown at the right in FIG. 1) of each of the peripheral edges 220, 110, 210 and 120 are aligned with one another. Another side (e.g., shown at the right in FIG. 1) of each of the peripheral edges 220, 130, 230 and 140 are aligned with one another. Another side (e.g., shown at the right in FIG. 1) of each of the peripheral edges 240 and 150 are aligned with one another.

A surface area of an upper surface of the conductive layer 11 is greater than a surface area of an upper surface of each of the conductive layers 12, 13, 14 and 15 and each of the insulating layers 21, 22, 23 and 24.

In one or more embodiments, the passivation layer 40 includes a polyimide (PI). In other embodiments, the passivation layer 40 is another suitable material that provides desired thermal, mechanical and electrical performance, with a desired level of chemical stability.

A hole 330 is defined by the passivation layer 40 to expose the conductive layer 12. A hole 340 is defined by the passivation layer 40 to expose the conductive layer 14. A hole 350 is defined by the passivation layer 40 to expose the conductive layer 15. A hole 360 is defined by the passivation layer 40 to expose the conductive layer 13. A hole 370 is defined by the passivation layer 40 to expose the conductive layer 11.

The interconnection structures 33, 34, 35, 36 and 37 are disposed in the holes 330, 340, 350, 360 and 370, respectively. The interconnection structure 33 is electrically connected to the conductive layer 12. The interconnection structure 34 is electrically connected to the conductive layer 14. The interconnection structure 35 is electrically connected to the conductive layer 15. The interconnection structure 36 is electrically connected to the conductive layer 13. The interconnection structure 37 is electrically connected to the conductive layer 11. In one or more embodiments, one or more of the interconnection structures 33, 34, 35, 36 and 37 is directly physically connected to the respective conductive layer 12, 14, 15, 13 and 11.

The conductive pads 31 and 32 are disposed on the passivation layer 40. In one or more embodiments, the conductive pads 31 and 32 are integrally formed with the interconnection structures 33, 34, 35, 36 and 37. In one or more embodiments, the conductive pads 31 and 32 include Cu. In other embodiments, the conductive pads 31 and 32 include another suitable metal or alloy. The conductive pad 31 is electrically connected to the interconnection structures 33 and 34. The conductive pad 32 is electrically connected to the interconnection structures 35, 36 and 37. In one or more embodiments, the conductive pad 31 is directly physically connected to the interconnection structures 33 and 34, and the conductive pad 32 is directly physically connected to the interconnection structures 35, 36 and 37.

The conductive pad 31 may be an input electrode and the conductive pad 32 may be an output electrode, or vice versa. The capacitors C1, C2, C3 and C4 are electrically connected (in parallel in this embodiment) with one another through the arrangement of the interconnection structures 33, 34, 35, 36 and 37 and the conductive pads 31 and 32.

Figure 1A:
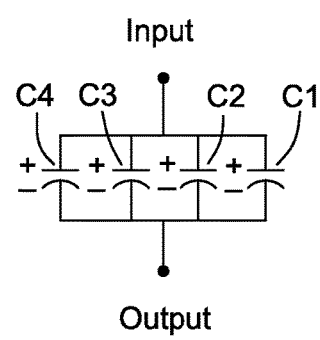
FIG. 1A is a schematic circuit diagram of the semiconductor device of FIG. 1.

FIG. 1A is a schematic circuit diagram of the semiconductor device 1 of FIG. 1. Referring to FIG. 1A, the capacitors C1, C2, C3 and C4 are connected in parallel with one another. The input terminal shown in FIG. 1A may be electrically connected to the conductive pad 31 of FIG. 1 and the output terminal may be electrically connected to the conductive pad 32 of FIG. 1, or vice versa.

Figure 2:
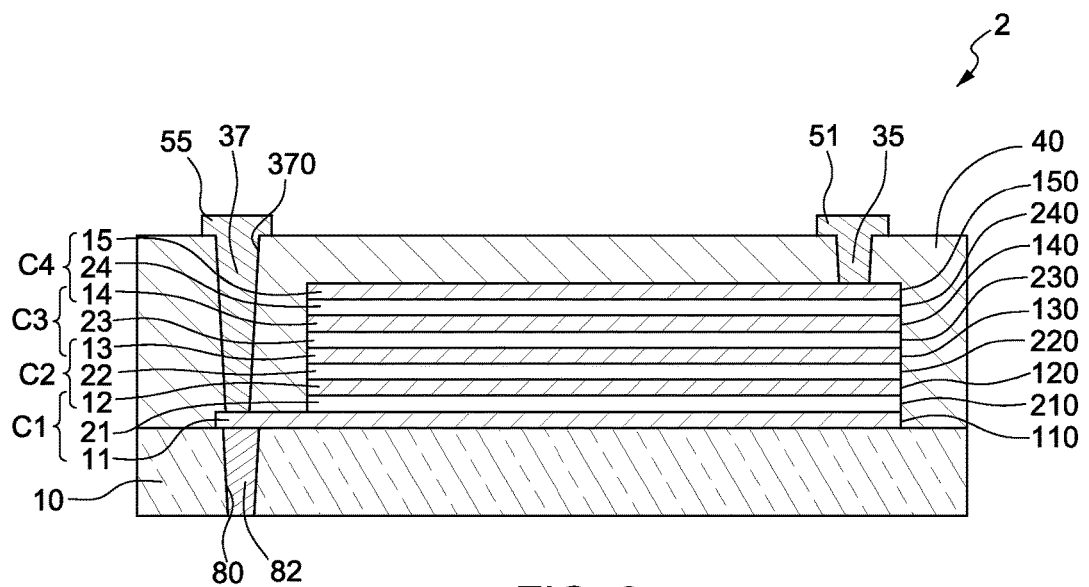
FIG. 2 is a cross-sectional view of a semiconductor device in accordance with another embodiment of the present disclosure.

FIG. 2 is a cross-sectional view of a semiconductor device 2 in accordance with another embodiment of the present disclosure. The semiconductor device 2 is similar to the semiconductor device 1 as described and illustrated with reference to FIG. 1, except that the peripheral edges 210, 120, 220, 130, 230, 140, 240 and 150 are aligned with one another, the interconnection structures 33, 34 and 36 are eliminated, and the conductive pads 31 and 32 are respectively replaced by conductive pads 51 and 55. Moreover, a side (e.g., shown at the right in FIG. 2) of each of the peripheral edges 110, 210, 120, 220, 130, 230, 140, 240 and 150 are aligned with one another. The conductive pad 51 is electrically connected to the conductive layer 15 via the interconnection structure 35. The conductive pad 55 is electrically connected to the conductive layer 11 via the interconnection structure 37. The capacitors C1, C2, C3 and C4 are connected in series by the arrangement of the interconnection structures 35 and 37 and the conductive pads 51 and 55.

Figure 2A:
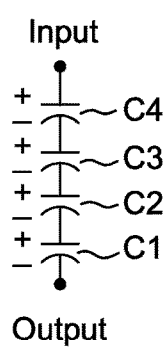
FIG. 2A is a schematic circuit diagram of the semiconductor device of FIG. 2.

FIG. 2A is a schematic circuit diagram of the semiconductor device 2 of FIG. 2. The capacitors C1, C2, C3 and C4 are connected in series. The input of the series-connected circuit may be electrically connected to the conductive pad 51 of FIG. 2 and the output may be electrically connected to the conductive pad 55 of FIG. 2, or vice versa.

Figure 3:
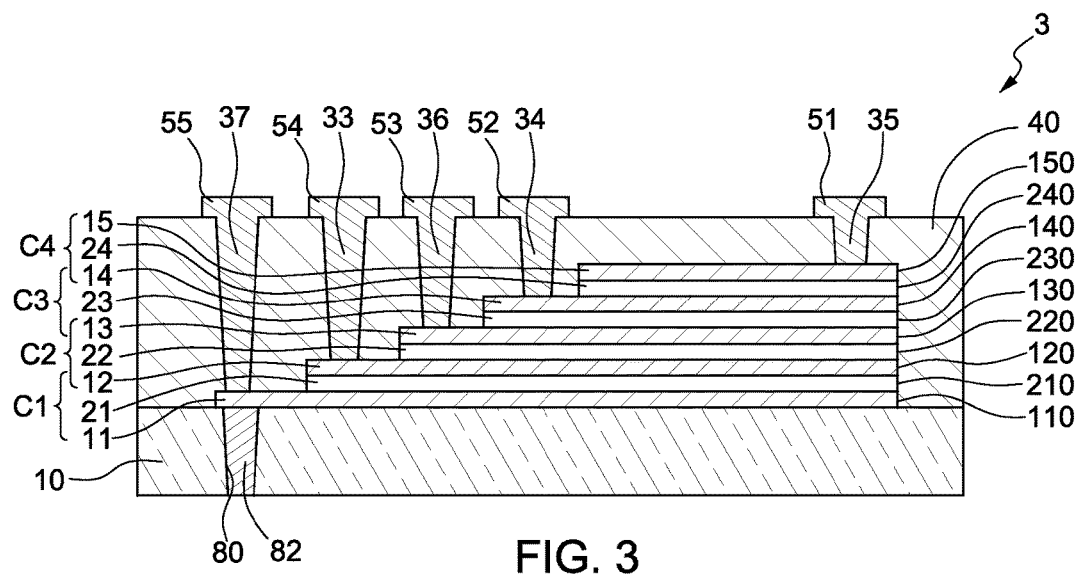
FIG. 3 is a cross-sectional view of a semiconductor device in accordance with another embodiment of the present disclosure.

FIG. 3 is a cross-sectional view of a semiconductor device 3 in accordance with another embodiment of the present disclosure. The semiconductor device 3 is similar to the semiconductor device 1 as described and illustrated with reference to FIG. 1, except that the conductive pads 31 and 32 are replaced by five separate conductive pads 51, 52, 53, 54 and 55, and the interconnection structures 35, 34, 36, 33 and 37 are electrically connected to the conductive pads 51, 52, 53, 54 and 55, respectively. Moreover, a side (e.g., shown at the right in FIG. 3) of each of the peripheral edges 110, 210, 120, 220, 130, 230, 140, 240 and 150 are aligned with one another. Another side (e.g., shown at the left in FIG. 3) of the peripheral edges 210 and 120 are aligned with each other. Another side (e.g., shown at the left in FIG. 3) of the peripheral edges 220 and 130 are aligned with each other. Another side (e.g., shown at the left in FIG. 3) of the peripheral edges 230 and 140 are aligned with each other. Another side (e.g., shown at the left in FIG. 3) of the peripheral edges 240 and 150 are aligned with each other. The capacitors C1, C2, C3 and C4 are in series. External connections may be made between two or more of the conductive pads 52, 53, 54 and 55 to create parallel connections of selected ones of the capacitors C1, C2, C3 and C4.

Figure 4:
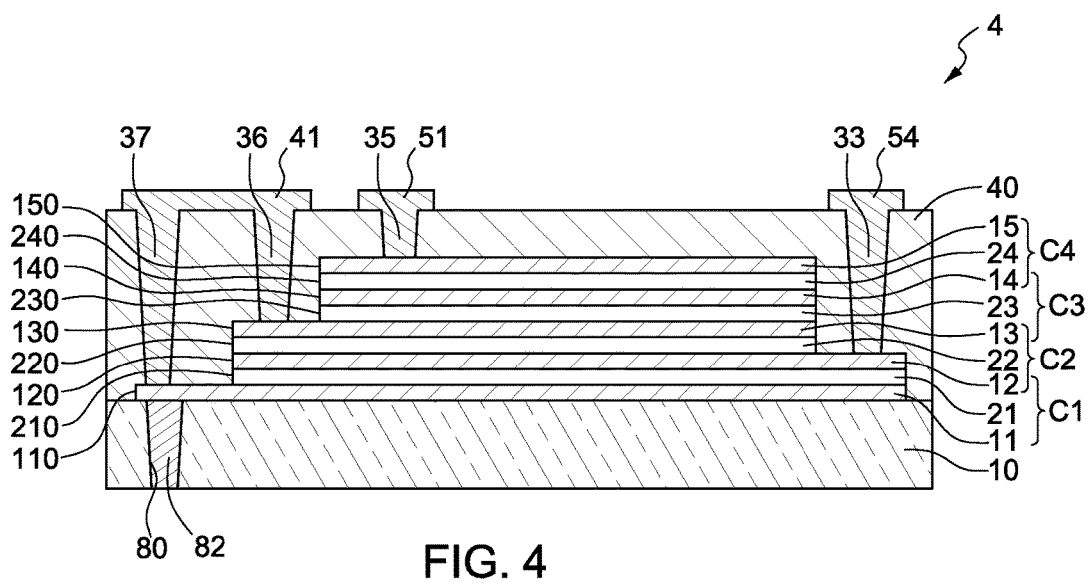
FIG. 4 is a cross-sectional view of a semiconductor device in accordance with another embodiment of the present disclosure.

FIG. 4 is a cross-sectional view of a semiconductor device 4 in accordance with another embodiment of the present disclosure. Referring to FIG. 4, the semiconductor device 4 is similar to the semiconductor device 1 as described and illustrated with reference to FIG. 1, except that a side (e.g., shown at the right in FIG. 4) of each of the peripheral edges 220, 130, 230, 140, 240 and 150 are aligned with one another, the conductive pad 31 is replaced by a conductive pad 54, the conductive pad 32 is replaced by two conductive pads 41 and 51, and the interconnection structure 34 is eliminated. The conductive pad 54 is electrically connected to the conductive layer 12 via the interconnection structure 33. The conductive pad 51 is electrically connected to the conductive layer 15 via the interconnection structure 35. The conductive pad 41 is electrically connected to the conductive layers 11 and 13 via the interconnection structure 37 and 36, respectively.

Figure 4A:
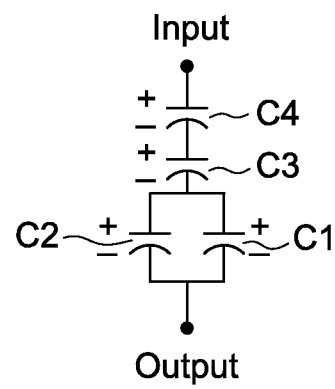
FIG. 4A is a schematic circuit diagram of the semiconductor device of FIG. 4.

FIG. 4A is a schematic circuit diagram of the semiconductor device 4 of FIG. 4. The capacitors C1 and C2 are connected in parallel. The parallel-connected capacitors C1 and C2 are connected in series with the capacitors C3 and C4. External connections may be made between the conductive pads 41 and 55 such that others of capacitors C1, C2, C3 and C4 are connected in parallel to one another.

Figure 5:
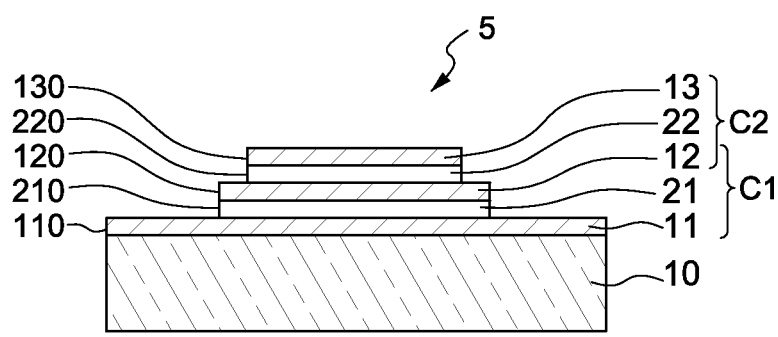
FIG. 5 is a cross-sectional view of a semiconductor device in accordance with another embodiment of the present disclosure.

FIG. 5 is a cross-sectional view of a semiconductor device 5 in accordance with another embodiment of the present disclosure. The semiconductor device 5 includes a substrate 10, conductive layers 11, 12 and 13, and insulating layers 21 and 22.

The conductive layer 11 is formed on the substrate 10. The insulating layer 21 is disposed on the conductive layer 11. The conductive layer 12 is disposed on the insulating layer 21. The insulating layer 22 is disposed on the conductive layer 12. The conductive layer 13 is disposed on the insulating layer 22.

The conductive layers 11 and 12, together with the insulating layer 21, form a capacitor C1. The conductive layers 12 and 13, together with the insulating layer 22, form a capacitor C2.

In one or more embodiments, the conductive layers 11, 12 and 13 include one or more of Al, Cu, or an alloy thereof (such as AlCu). In other embodiments, the conductive layers 11, 12 and 13 include other suitable conductive materials, metals or alloys. The conductive layers 11, 12 and 13 may include the same materials or different materials.

In one or more embodiments, the insulating layers 21 and 22 include a metal oxide, such as an oxide of Ta (e.g., $Ta_2O_5$). In other embodiments, the insulating layers 21 and 22 include another suitable insulating material. The insulating layers 21 and 22 may include the same materials or different materials.

In one or more embodiments, a top conductive layer of the semiconductor device 5 (e.g., the conductive layer 13 in the embodiment illustrated in FIG. 5) includes one or more of Al or Cu, or an alloy thereof (such as AlCu). In other embodiments, the top conductive layer includes another suitable conductive material, metal or alloy.

The conductive layer 11 has a peripheral edge 110. The insulating layer 21 has a peripheral edge 210. The conductive layer 12 has a peripheral edge 120. The insulating layer 22 has a peripheral edge 220. The conductive layer 13 has a peripheral edge 130.

The peripheral edges 210 and 120 are aligned with each other. The peripheral edges 220 and 130 are aligned with each other. A surface area of an upper surface of the conductive layer 12 is approximately equal to a surface area of an upper surface of the insulating layer 21, and a surface area of an upper surface of the conductive layer 13 is approximately equal to a surface area of an upper surface of the insulating layer 22. A surface area of an upper surface of the conductive layer 11 is greater area than the surface area of the upper surface of the conductive layer 12, and a surface area of an upper surface of the conductive layer 12 is greater area than the surface area of the upper surface of the conductive layer 13.

Figure 6A:
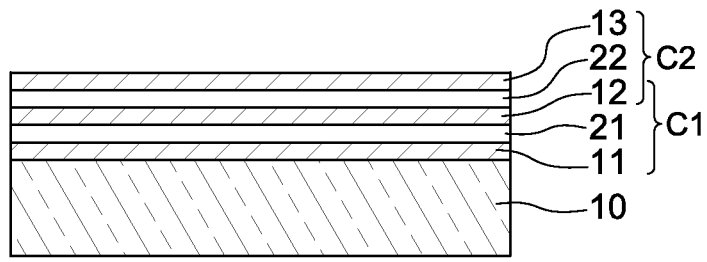
FIG. 6A and FIG. 6B illustrate a method of manufacturing the semiconductor device of FIG. 5.
Figure 6B:
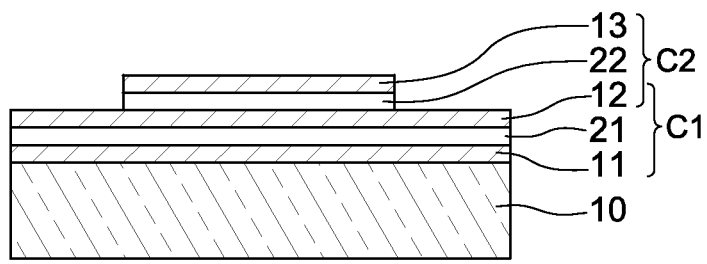

FIG. 6A and FIG. 6B illustrate a method of manufacturing a semiconductor device in accordance with an embodiment of the present disclosure. Referring to FIG. 6A, a substrate 10 including one or more of glass, silicon and $SiO_2$ is provided. Conductive layers 11, 12 and 13 and insulating layers 21 and 22 are formed on the substrate 10 in a sequential manner (e.g., in the order 11, 21, 12, 22, 13). The conductive layers 11, 12 and 13 may be formed, for example, by coating, sputtering, plating or another suitable technique. In one or more embodiments, the conductive layers 11, 12 and 13 include one or more of Al or Cu, or an alloy thereof (such as AlCu). In other embodiments, the conductive layers 11, 12 and 13 include another suitable conductive material, metal or alloy. The insulating layers 21 and 22 may be formed, for example, by coating or sputtering, or by plating a metal layer which is subsequently treated by an anodic oxidation to form a metal oxide layer. For example, the insulating layer 21 may be formed by sputtering a Ta layer on the conductive layer 11, and treating the Ta layer with an anodic oxidation to form the insulating layer 21, which includes $Ta_2O_5$.

Referring to FIG. 6B, portions of the conductive layer 13 and the insulating layer 22 are removed, such as by photolithography and etching techniques. An etchant used to remove the conductive layer 13 may be different from an etchant used to remove the insulating layer 22. For example, a patterned mask (not shown in FIG. 6B) may be formed on the conductive layer 13 to protect portions of the conductive layer 13 from an etchant used to remove unprotected portions of the conductive layer 13. Subsequently, a different etchant may be used to remove the insulating layer 22, which may also remove a portion of the mask.

Similar techniques as described with respect to removing portions of the conductive layer 13 and the insulating layer 22 may be used to remove portions of the conductive layer 12 and the insulating layer 21, to form the semiconductor device 5 of FIG. 5. Subsequently, a surface area of an upper surface of the conductive layer 11 is greater area than a surface area of an upper surface of the conductive layer 12, and the surface area of the upper surface of the conductive layer 12 is greater than a surface area of an upper surface of the conductive layer 13.

The different etchants used are chosen so as to selectively etch conductive layers (e.g., conductive layers 13, 12) or to selectively etch insulating layers (e.g., insulating layers 22, 21). As a result, the surface area of the upper surface of the conductive layer 12 is approximately equal to a surface area of an upper surface of the insulating layer 21, and the surface area of the upper surface of the conductive layer 13 is approximately equal to a surface area of an upper surface of the insulating layer 22.

Figure 7:
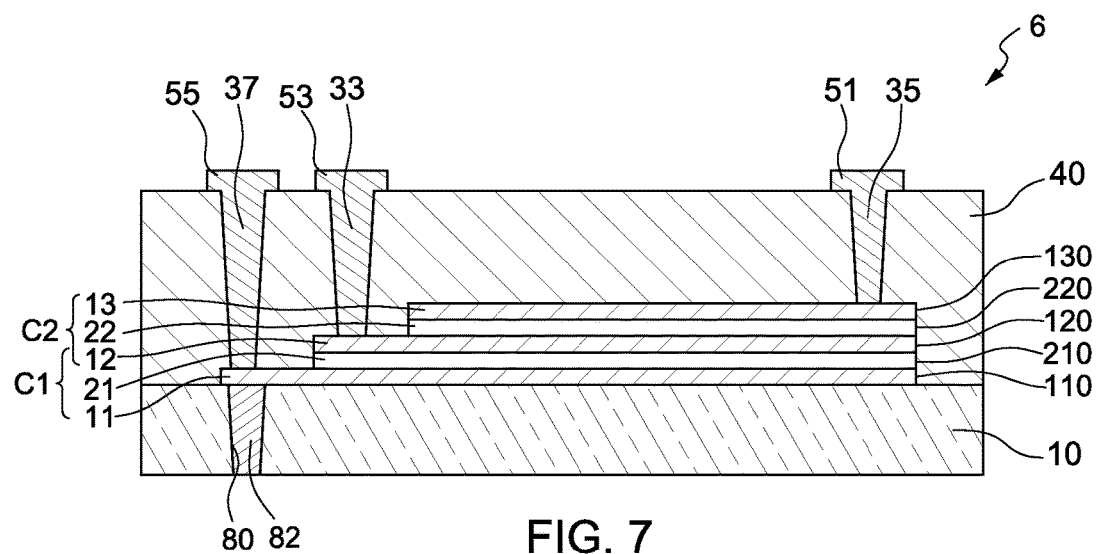
FIG. 7 is a cross-sectional view of a semiconductor device in accordance with another embodiment of the present disclosure.

FIG. 7 is a cross-sectional view of a semiconductor device 6 in accordance with another embodiment of the present disclosure. The semiconductor device 6 is similar to the semiconductor device 1 as described and illustrated with reference to FIG. 1, except that the insulating layers 23 and 24, the conductive layers 14 and 15, the conductive pads 31 and 32, and the interconnection structures 34 and 36 are eliminated. A side (e.g., shown at the right in FIG. 7) of each of the peripheral edges 110, 210, 120, 220 and 130 are aligned with one another. Another side (e.g., shown at the left in FIG. 7) of the peripheral edges 130 and 220 are aligned with one another, and another side (e.g., shown at the left in FIG. 7) of the peripheral edges 120 and 210 are aligned with one another. Conductive pads 51, 53 and 55 electrically connect to the interconnection structures 35, 33 and 37, respectively.

Figure 8A:
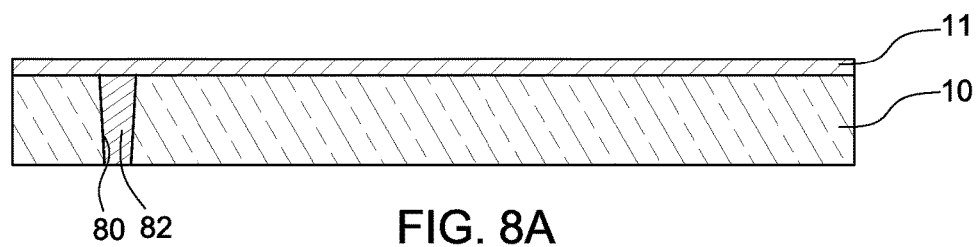
FIG. 8A, FIG. 8B, FIG. 8C, FIG. 8D, FIG. 8E, FIG. 8F, FIG. 8G, FIG. 8H, and FIG. 8I illustrate a method of manufacturing the semiconductor device of FIG. 7.

FIGS. 8A-8I illustrate a method of manufacturing a semiconductor device. Referring to FIG. 8A, a substrate 10 is provided. In one or more embodiments, substrate 10 includes one or more of glass, silicon and $SiO_2$. A through hole 80 is formed, such as by an etching technique. A conductive material is filled into the through hole 80 to form a conductive post 82, such as by using a plating technique. A conductive layer 11 is formed on a top surface of the substrate 10 by coating, sputtering, plating or another suitable technique. The conductive layer 11 is electrically connected to the conductive post 82, and may further be directly physically connected to the conductive post 82. In one or more embodiments, the conductive layer 11 includes one or more of Al or Cu, or an alloy thereof (such as AlCu). In other embodiments, the conductive layer 11 includes another suitable conductive material, metal or alloy.

Figure 8B:
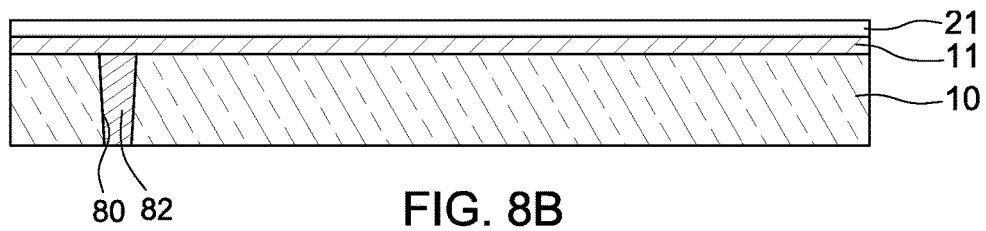

Referring to FIG. 8B, an insulating layer 21 is formed over the conductive layer 11. In one or more embodiments, the insulating layer 21 includes a metal oxide, such as a Ta oxide (e.g., $Ta_2O_5$). In other embodiments, the insulating layer 21 includes another suitable insulating material.

Figure 8C:
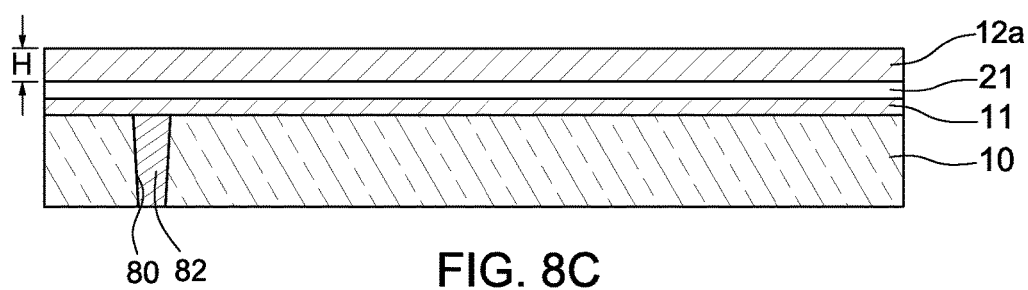

Referring to FIG. 8C, a conductive layer 12a is disposed on the insulating layer 21. In one or more embodiments, the conductive layer 12a includes Ta. In other embodiments, the conductive layer 12a includes another suitable metal. The conductive layer 12a has a thickness from about 1500 angstroms (Å) to about 4000 Å, such as about 1500 Å to about 2000 Å, about 2000 Å to about 4000 Å, about 3000 Å to about 4000 Å, or about 1500 Å to about 2500 Å.

Figure 8D:
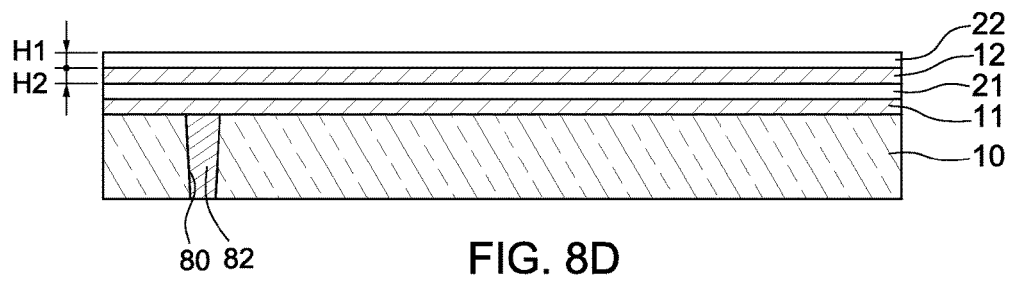

Referring to FIG. 8D, an anodic oxidation treatment is performed on a top surface of the conductive layer 12a to oxidize an upper portion of the conductive layer 12a, thereby forming an insulating layer 22. The unoxidized portion of the conductive layer 12a forms the conductive layer 12. The conductive layer 12 has a resulting thickness from about 400 Å to about 2900 Å, and the insulating layer 22 has a resulting thickness from about 2800 Å to about 6000 Å.

Figure 8E:
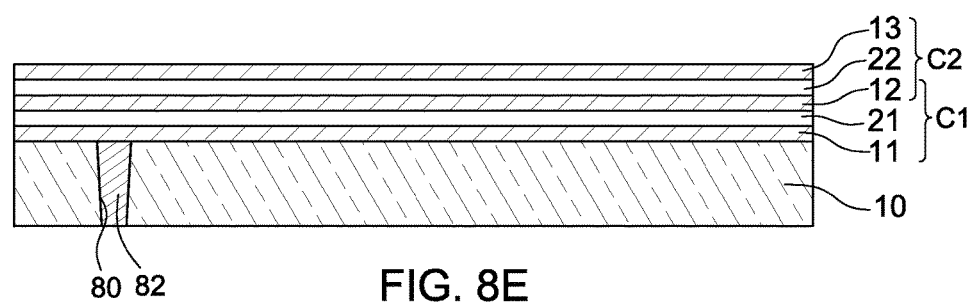

Referring to FIG. 8E, a conductive layer 13 is formed on the insulating layer 22, such as by coating, sputtering, plating or another suitable technique. In one or more embodiments, the conductive layer 13 includes one or more of Al or Cu, or an alloy thereof (such as AlCu). In other embodiments, the conductive layer 13 includes another suitable conductive material, metal or alloy. In accordance with another embodiment of the present disclosure, the conductive layer 13 is formed in the same or similar manner as the forming of the conductive layer 12.

Figure 8F:
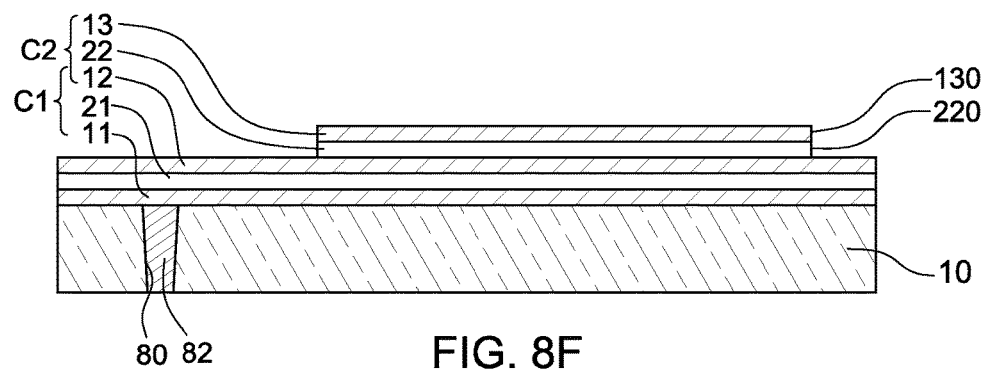

Referring to FIG. 8F, a portion of the conductive layer 13 and the insulating layer 22 is removed, such as by photolithography and etching techniques. An etchant used to remove the conductive layer 13 is different from an etchant used to remove the insulating layer 22, such that the etchants selectively etch one layer with minimal impact to the other layer. In this manner, a peripheral edge 130 of the conductive layer 13 and a peripheral edge 220 of the insulating layer 22 are aligned with each other.

Figure 8G:
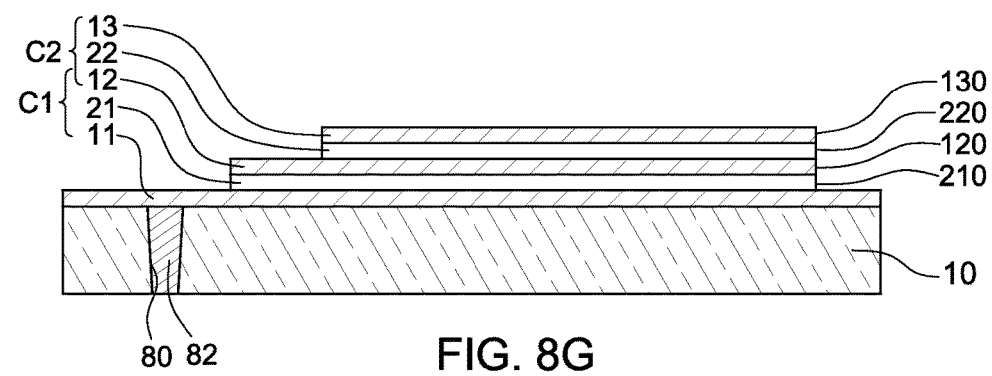

Referring to FIG. 8G, a portion of the conductive layer 12 and the insulating layer 21 may be removed by a technique similar to that used in FIG. 8F, such that a peripheral edge 210 of the insulating layer 21 and a peripheral edge 120 of the conductive layer 12 are aligned with each other. In this embodiment, sides (e.g., shown at the right in FIG. 8G) of the peripheral edges 210, 120, 220 and 130 are aligned with one another.

Figure 8H:
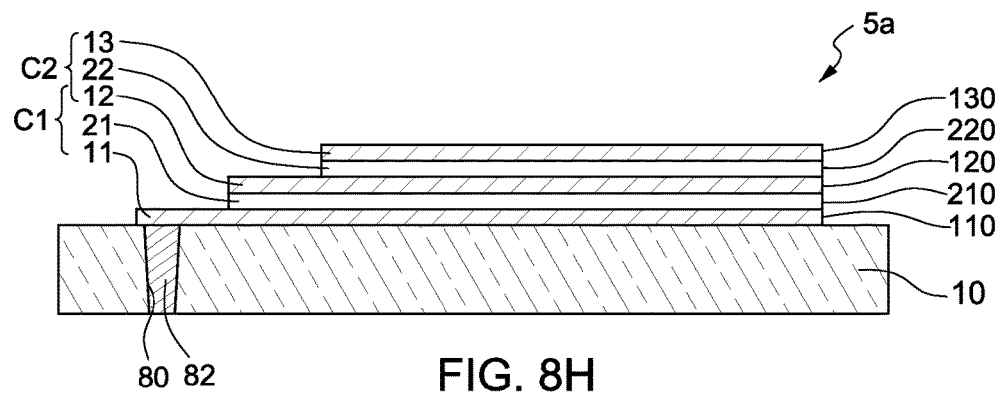

Referring to FIG. 8H, a portion of the conductive layer 11 is removed using a technique similar to the technique used to remove the conductive layer 13 (FIG. 8F), such that a side (e.g., shown at the right in FIG. 8G) of a peripheral edge 110 of the conductive layer 11 is aligned with sides of the peripheral edges 210, 120, 220 and 130.

Figure 8I:
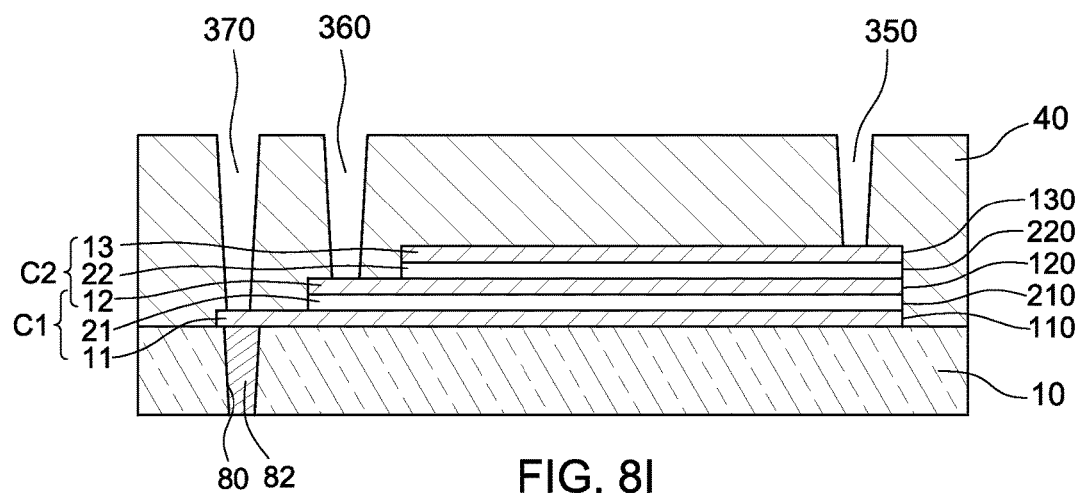

Referring to FIG. 8I, a passivation layer 40 is formed to cover the semiconductor device 5a of FIG. 8H. A plurality of holes 350, 360 and 370 are formed in the passivation layer 40, such as by an etching technique or a laser drilling technique. Interconnection structures may be formed (not shown in FIG. 8I), such as by filling or plating the holes 350, 360 and 370 with a conductive material (e.g., Cu). For example, interconnection structures 33, 35 and 37 of FIG. 7 may be formed in this manner. To further form the semiconductor device 6 of FIG. 7, a first conductive pad (e.g., 51) may be formed to electrically connect to a first interconnection structure (e.g., 35), a second conductive pad (e.g., 53) may be formed to electrically connect to a second interconnection structure (e.g., 33) and a third conductive pad (e.g., 55) may be formed to electrically connect to a third interconnection structure (e.g., 37). The conductive pads (e.g., 51, 53 and 55) may be formed, for example, by photolithography and plating techniques.

Figure 9:
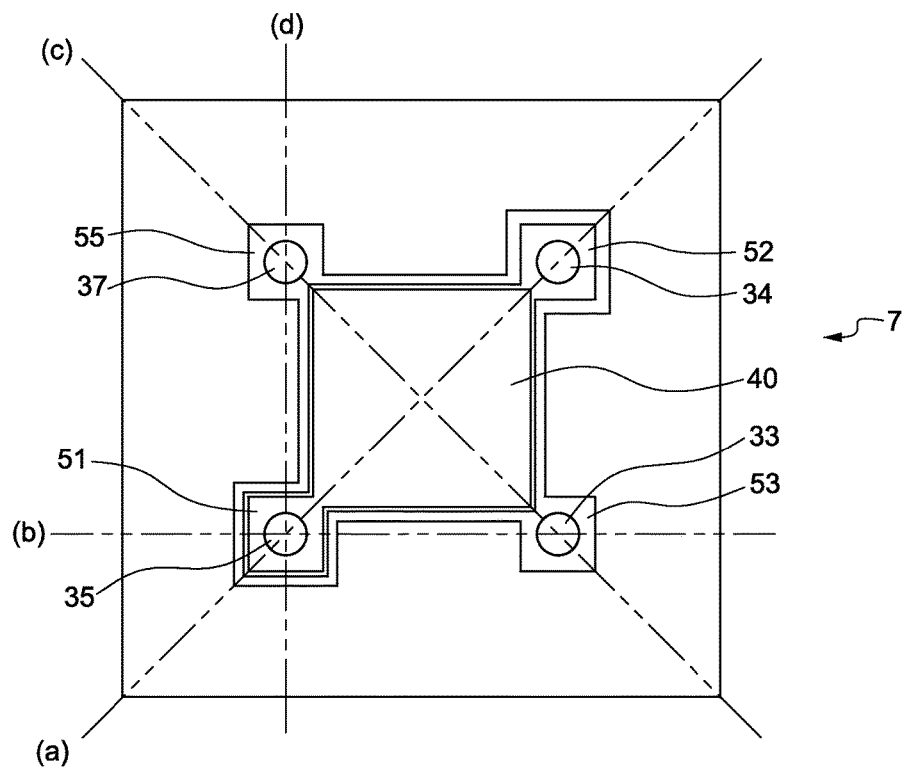
FIG. 9 is a top view of a semiconductor device in accordance with an embodiment of the present disclosure.

FIG. 9 is top view of a semiconductor device in accordance with an embodiment of the present disclosure. Referring to FIG. 9, a semiconductor device 7 may include a passivation layer 40 and a plurality of conductive pads 51, 52, 53 and 55 on the passivation layer 40.

Figure 10A:
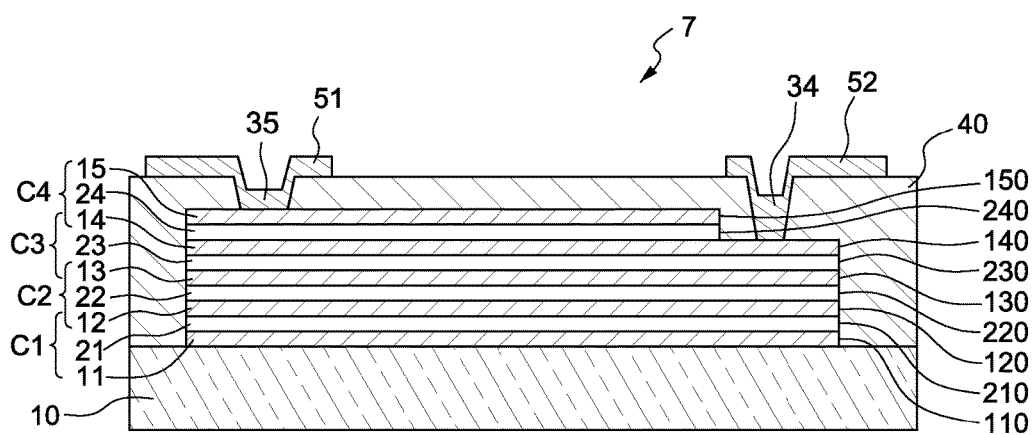
FIG. 10A is a cross-sectional view across line (a) of the semiconductor device of FIG. 9 in accordance with an embodiment of the present disclosure.

FIG. 10A is a cross-sectional view across line (a) of the semiconductor device 7 of FIG. 9 in accordance with an embodiment of the present disclosure. Referring to FIG. 10A, the semiconductor device 7 includes a substrate 10, conductive layers 11, 12, 13, 14 and 15, insulating layers 21, 22, 23, and 24, a passivation layer 40, conductive pads 51 and 52, and interconnection structures 34 and 35. A side (e.g., shown at the left in FIG. 10A) of each of the peripheral edges 110, 210, 120, 220, 130, 230, 140, 240 and 150 are aligned with one another. Another side (e.g., shown at the right in FIG. 10A) of each of the peripheral edges 110, 210, 120, 220, 130, 230 and 140 are aligned with one another, and another side (e.g., shown at the right in FIG. 10A) of the peripheral edges 240 and 150 are aligned with each other. The interconnection structure 35 electrically connects the pad 51 to the conductive layer 15. The interconnection structure 34 electrically connects the pad 52 to the conductive layer 14. In one or more embodiments, the interconnection structures 34, 35 directly physically connect the respective pads 52, 51 to the respective conductive layers 14, 15. In one or more embodiments, the pad 51 is integrally formed with the interconnection structure 35, and the pad 52 is integrally formed with the interconnection structure 34.

Figure 10B:
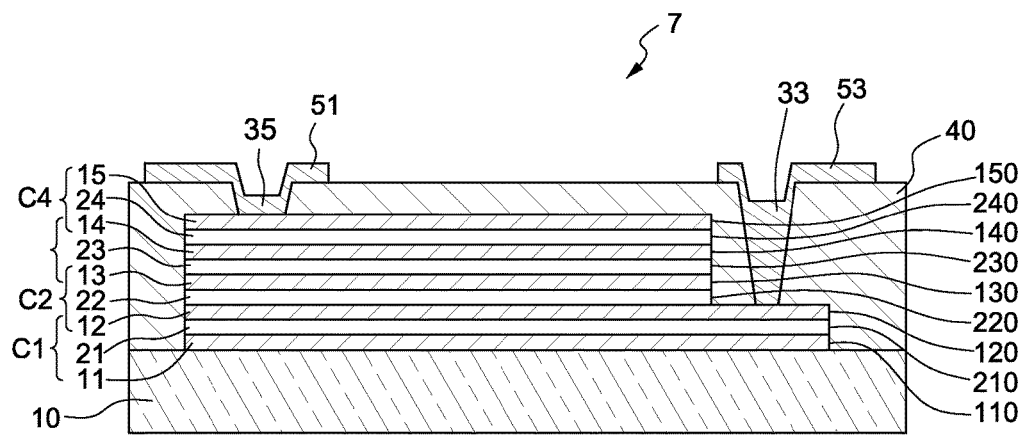
FIG. 10B is a cross-sectional view across line (b) of the semiconductor device of FIG. 9 in accordance with an embodiment of the present disclosure.

FIG. 10B is a cross-sectional view across line (b) of the semiconductor device 7 of FIG. 9 in accordance with another embodiment of the present disclosure. The semiconductor device 7 includes a substrate 10, conductive layers 11, 12, 13, 14 and 15, insulating layers 21, 22, 23, and 24, a passivation layer 40, conductive pads 51 and 53 and interconnection structures 33 and 35. A side (e.g., shown at the left in FIG. 10B) of each of the peripheral edges 110, 210, 120, 220, 130, 230, 140, 240 and 150 are aligned with one another. Another side (e.g., shown at the right in FIG. 10B) of each of the peripheral edges 130, 230, 140, 240 and 150 are aligned with one another, and another side (e.g., shown at the right in FIG. 10B) of each of the peripheral edges 110, 210 and 120 are aligned with one another. The interconnection structure 35 electrically connects the pad 51 to the conductive layer 15. The interconnection structure 33 electrically connects the pad 53 to the conductive layer 12. In one or more embodiments, the interconnection structures 33, 35 directly physically connect the respective pads 53, 51 to the respective conductive layers 12, 15. In one or more embodiments, the pad 51 is integrally formed with the interconnection structure 35, and the pad 53 is integrally formed with the interconnection structure 33.

Figure 10C:
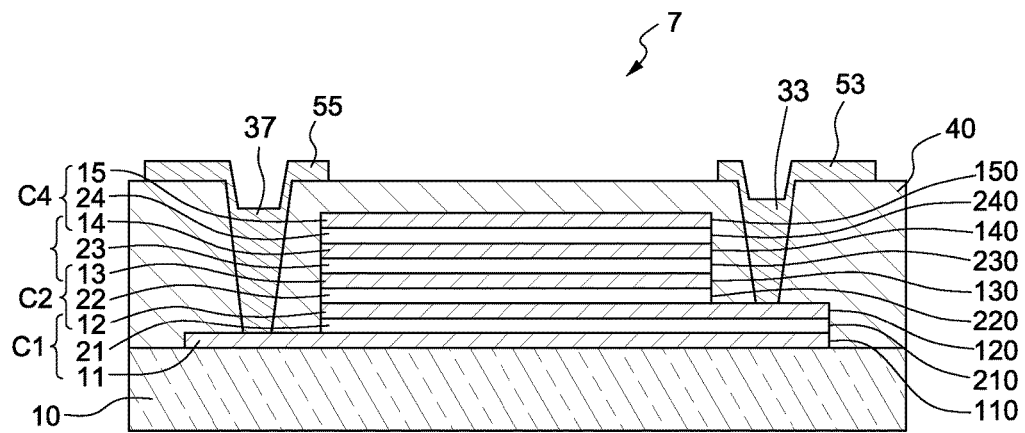
FIG. 10C is a cross-sectional view across line (c) of the semiconductor device of FIG. 9 in accordance with an embodiment of the present disclosure.

FIG. 10C is a cross-sectional view across line (c) of the semiconductor device 7 of FIG. 9 in accordance with another embodiment of the present disclosure. The semiconductor device 7 includes a substrate 10, conductive layers 11, 12, 13, 14 and 15, insulating layers 21, 22, 23, and 24, a passivation layer 40, conductive pads 53 and 55 and interconnection structures 33 and 37. A side (e e.g., shown at the left in FIG. 10C) of each of the peripheral edges 210, 120, 220, 130, 230, 140, 240 and 150 are aligned with one another. Another side (e.g., shown at the right in FIG. 10C) of each of the peripheral edges 220, 130, 230, 140, 240 and 150 are aligned with one another, and another side (e.g., shown at the right in FIG. 10C) of each of the peripheral edges 110, 210 and 120 are aligned with one another. The interconnection structure 37 electrically connects the pad 55 to the conductive layer 11. The interconnection structure 33 electrically connects the pad 53 to the conductive layer 12. In one or more embodiments, the interconnection structures 33, 37 directly physically connect the respective pads 53, 55 to the respective conductive layers 12, 11. In one or more embodiments, the pad 53 is integrally formed with the interconnection structure 33, and the pad 55 is integrally formed with the interconnection structure 37.

Figure 10D:
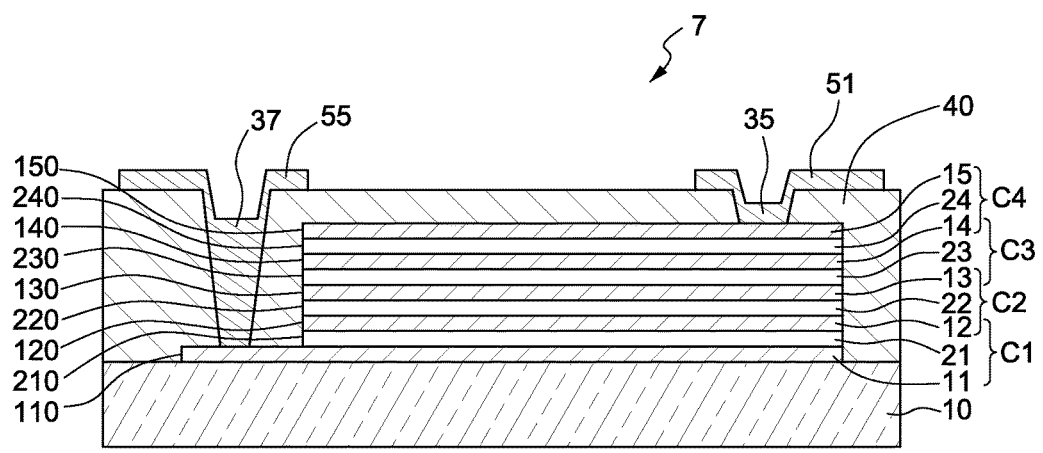
FIG. 10D is a cross-sectional view across line (d) of the semiconductor device of FIG. 9 in accordance with an embodiment of the present disclosure.

FIG. 10D is a cross-sectional view across line (d) of the semiconductor device 7 of FIG. 9 in accordance with another embodiment of the present disclosure. The semiconductor device 7 includes a substrate 10, conductive layers 11, 12, 13, 14 and 15, insulating layers 21, 22, 23, and 24, a passivation layer 40, conductive pads 51 and 55 and interconnection structures 35 and 37. A side (e.g., shown at the left in FIG. 10D) of each of the peripheral edges 210, 120, 220, 130, 230, 140, 240 and 150 are aligned with one another. Another side (e.g., shown at the right in FIG. 10D) of each of the peripheral edges 110, 210, 120, 220, 130, 230, 140, 240 and 150 are aligned with one another. The interconnection structure 37 electrically connects the pad 55 to the conductive layer 11. The interconnection structure 35 electrically connects the pad 51 to the conductive layer 15. In one or more embodiments, the interconnection structures 35, 37 directly physically connect the respective pads 51, 55 to the respective conductive layers 15, 11. In one or more embodiments, the pad 51 is integrally formed with the interconnection structure 35, and the pad 55 is integrally formed with the interconnection structure 37.

FIGS. 10A-10D illustrate the semiconductor device 7 from different aspects. Such variability in formation of capacitor structures facilitates flexibility of circuit design and miniaturization of the semiconductor device 7.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a substrate;
   a first capacitor comprising a first conductive layer, a first insulating layer and a second conductive layer, the first insulating layer having a first peripheral edge, and the second conductive layer having a second peripheral edge;
   a second capacitor comprising a third conductive layer, a second insulating layer and the second conductive layer, the second insulating layer having a third peripheral edge, and the third conductive layer having a fourth peripheral edge;
   a conductive post extending through the substrate and directly connected to the first conductive layer;
   a passivation layer surrounding the first capacitor and the second capacitor;
   conductive pads disposed on the passivation layer, wherein the conductive pads comprise a first conductive pad configured as an input electrode and a second conductive pad configured as an output electrode; and
   interconnect structures extending through the passivation layer, each interconnect structure connected to a corresponding one of the first, second, and third conductive layers and one of the conductive pads, wherein the interconnect structures include:
   a first interconnect structure connected to the first conductive layer;
   a second interconnect structure connected to the second conductive layer; and
   a third interconnect structure connected to the third conductive layer;
   wherein the first interconnect structure, the second interconnect structure, and the third interconnect structure are configurably connected for external access to any of: the first capacitor, the second capacitor, or the first capacitor and the second capacitor in parallel, and
   wherein at least a first side of each of the first, second, third and fourth peripheral edges are aligned with one another, and a second side of at least one of the first, second, third and fourth peripheral edges is laterally displaced from the second side of at least another one of the first, second, third and fourth peripheral edges.

2. The semiconductor device of claim 1, further comprising a third capacitor comprising a fourth conductive layer, a third insulating layer and the third conductive layer, the third insulating layer disposed on the third conductive layer, and the fourth conductive layer disposed on the third insulating layer.

3. The semiconductor device of claim 1, wherein the second conductive layer and the third conductive layer include a metal or alloy.

4. The semiconductor device of claim 3, wherein the metal or alloy is one of tantalum or an alloy of aluminum and copper.

5. The semiconductor device of claim 3, wherein the first insulating layer and the second insulating layer are formed of an oxide of the metal or alloy.

6. The semiconductor device of claim 1, further comprising a through via in the substrate.

7. The semiconductor device of claim 1, wherein the first capacitor and the second capacitor are electrically connected.

8. The semiconductor device of claim 2, wherein the third capacitor and the first capacitor are electrically connected.

9. The semiconductor device of claim 2, wherein the third capacitor and the second capacitor are electrically connected.

10. The semiconductor device of claim 1, wherein the first conductive layer is disposed on the substrate, the first insulating layer is disposed on the first conductive layer, the second conductive layer is disposed on the first insulating layer, the second insulating layer is disposed on the second conductive layer, and the third conductive layer is disposed on the second insulating layer.

11. A semiconductor device, comprising:
   a substrate;
   a first capacitor comprising a first conductive layer, a first insulating layer and a second conductive layer, the first insulating layer having a first peripheral edge, and the second conductive layer having a second peripheral edge;
   a conductive post extending through the substrate and directly connected to the first conductive layer;
   a second capacitor comprising a third conductive layer, a second insulating layer and the second conductive layer, the second insulating layer having a third peripheral edge, and the third conductive layer having a fourth peripheral edge;
   a third capacitor comprising a fourth conductive layer, a third insulating layer and the third conductive layer, the third insulating layer having a fifth peripheral edge, and the fourth conductive layer having a sixth peripheral edge;

a fourth capacitor comprising a fifth conductive layer, a fourth insulating layer and the fourth conductive layer, the fourth insulating layer having a seventh peripheral edge, and the fifth conductive layer having an eighth peripheral edge; and a plurality of conductive pads, each conductive pad coupled to the first conductive layer, the second conductive layer, the third conductive layer, the fourth conductive layer, or the fifth conductive layer, such that each of the first capacitor, the second capacitor, the third capacitor and the fourth capacitor are selectively configurable in parallel with others of the first capacitor, the second capacitor, the third capacitor and the fourth capacitor by connections among the plurality of conductive pads, wherein the conductive pads comprise a first conductive pad configured as an input electrode and a second conductive pad configured as an output electrode, wherein at least a first side of each of at least four of a group of edges are aligned with one another, the group of edges consisting of the first, second, third, fourth, fifth, sixth, seventh and eighth peripheral edges, and a second side of at least one of the group of edges is laterally displaced from the second side of at least another one of the group of edges.

12. The semiconductor device of claim 11, wherein the conductive pads externally electrically connect the first capacitor, the second capacitor, the third capacitor and the fourth capacitor in parallel.

13. The semiconductor device of claim 11, wherein the first conductive layer is disposed on the substrate, the first insulating layer is disposed on the first conductive layer, the second conductive layer is disposed on the first insulating layer, the second insulating layer is disposed on the second conductive layer, the third conductive layer is disposed on the second insulating layer, the third insulating layer is disposed on the third conductive layer, the fourth conductive layer is disposed on the third insulating layer, the fourth insulating layer is disposed on the fourth conductive layer, and the fifth conductive layer is disposed on the fourth insulating layer.

14. A semiconductor device, comprising:
a substrate;
a conductive post extending through the substrate;
a number n of capacitors, the capacitors together comprising a number n+1 of conductive layers and the number n of insulating layers, the insulating layers interspersed between the conductive layers, such that a number n−1 of the conductive layers are shared conductive layers, each of which is a shared conductive layer of two neighboring capacitors;

a passivation layer surrounding the capacitors;
conductive pads disposed on the passivation layer; and
interconnection structures extending through the passivation layer, each interconnection structure connected to a corresponding one of the conductive layers and a corresponding one of the conductive pads, the conductive pads configurable to electrically couple at least two first capacitors of the n capacitors in parallel, wherein:
the conductive pads comprise a first conductive pad configured as an input electrode and a second conductive pad configured as an output electrode;
the n+1 conductive layers comprise a first conductive layer and a second conductive layer, each with a peripheral edge;
the conductive post is directly connected to the first conductive layer;
the n insulating layers comprise a first insulating layer and a second insulating layer, each with a peripheral edge;
a layer group consists of the first conductive layer, the second conductive layer, the first insulating layer and the second insulating layer; and
a side of each of the peripheral edges of three members of the layer group are aligned with one another, and are laterally displaced from the side of the peripheral edge of a remaining member of the layer group.

15. The semiconductor device of claim 14, further comprising a substrate; wherein:
the first conductive layer is disposed on the substrate, the first insulating layer is disposed on the first conductive layer, the second conductive layer is disposed on the first insulating layer, and the second insulating layer is disposed on the second conductive layer.

16. The semiconductor device of claim 14, wherein the capacitors being disposed on a first surface of the substrate and electrically connected to a second surface of the substrate through the conductive post.

* * * * *